United States Patent
Krywanczyk et al.

(10) Patent No.: US 7,135,124 B2
(45) Date of Patent: Nov. 14, 2006

(54) METHOD FOR THINNING WAFERS THAT HAVE CONTACT BUMPS

(75) Inventors: Timothy C. Krywanczyk, Essex Junction, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 10/713,659

(22) Filed: Nov. 13, 2003

(65) Prior Publication Data

US 2005/0106879 A1 May 19, 2005

(51) Int. Cl.
*H01L 21/302* (2006.01)
*C23F 1/00* (2006.01)
*B24B 1/00* (2006.01)

(52) U.S. Cl. ............... 216/88; 216/89; 438/692; 438/693; 451/57

(58) Field of Classification Search ............... 438/692, 438/693; 216/88, 89; 451/57
See application file for complete search history.

(56) References Cited

U.S. PATENT DOCUMENTS 6,120,360 A * 9/2000 Ball et al. ............... 451/65

6,416,616 B1 7/2002 Walker
6,638,389 B1 * 10/2003 Kassir et al. ............... 156/286
6,702,652 B1 * 3/2004 Arai ............... 451/41

FOREIGN PATENT DOCUMENTS

| JP | 01-222450 | * | 9/1989 |
| JP | 02-239621 | * | 9/1990 |
| JP | 2002-319558 | * | 10/2002 |

* cited by examiner

*Primary Examiner*—George A. Goudreau
(74) *Attorney, Agent, or Firm*—George R. McGuire; Bond Schoeneck & King PLLC

(57) ABSTRACT

In accordance with the foregoing objects and advantages, the present invention provides a fabrication device that may be used during the grinding operation of the fabrication process. The fabrication device comprises a socket plate that includes a plurality of cavities formed therein that correspond in position and number to the solder (or other conductive material) bumps formed on the front surface of a product wafer.

4 Claims, 3 Drawing Sheets

METHOD FOR THINNING WAFERS THAT HAVE CONTACT BUMPS

BACKGROUND OF THE INVENTION

1. Field Of Invention

The present invention relates generally to semiconductor wafers, and more particularly to the devices and methods for fabricating wafers having solder bumps formed on one surface thereof.

2. Background

The desire for smaller, thinner, lighter electronic components has driven the semiconductor packaging industry to develop tools and processes for wafer backside thinning by grinding and polishing before the wafers are diced into chips. As packaging assemblers develop more sophisticated multi-chip packages containing multiple die which are often stacked in a 3D assembly, the need for thinner die becomes more acute.

Wirebond stacked die packages may contain die thinned to less than 200 um, with even more aggressive thinning anticipated in the future. Because the surface of a wafer being processed for wire bonded interconnects is planar, the mechanical process of backside grinding and surface finishing is capable of removing greater than 90% of the original wafer thickness without breakage or lattice damage. These techniques have enabled the manufacture of extremely thin stacked wirebond package assemblies for advanced electronics.

With increasing semiconductor complexity comes the desire for greater signal bandwidth, which requires that the semiconductor chips have higher interconnect density from the die to the module substrate, or in the case of stacked assemblies, from die to die. Higher performance interconnects are achieved by switching from wirebond to solder bump connections. However, since the solder bumping process must be done with unthinned wafers, the 30–100 um solder bump feature creates significant challenges to obtain wafer backside thinning comparable to what is achieved today for wirebond wafers.

Thinning of wafers with solder bumps is done today by using a compliant tape on the wafer front side to conform around, cushion, and protect the solder bumps during the grinding process. This is reasonably effective for final wafer thicknesses greater than 300 um. For thinner dimensions, a tape with higher compliancy allows for replication of the underlying bump features especially in dissimilar pattern density regions of the bumps. Conversely, a tape with lower compliancy may also reflect pattern density differences as well as posing difficulty in removal. These issues have prevented the packaging industry from embracing thin single and multi-chip stacked die packaging for solder bumped wafers.

3. Objects and Advantages

It is therefore a principal object and advantage of the present invention to provide a fabrication device and method for permitting the effective thinning of bumped wafers through a grinding operation.

It is another object and advantage of the present invention to provide a fabrication device that permits backside grinding of bumped wafers to thinner dimensions than is presently feasible.

It is a further object and advantage of the present invention to provide a fabrication device that is easily adapted to existing fabrication processes.

Other objects and advantages of the present invention will in part be obvious, and in part appear hereinafter.

SUMMARY OF THE INVENTION

In accordance with the foregoing objects and advantages, the present invention provides a fabrication device that may be used during the grinding operation of the fabrication process. The fabrication device comprises a socket plate that includes a plurality of cavities formed therein that correspond in position and number to the solder (or other conductive material) bumps formed on the front surface of a product wafer. Prior to the back-grinding process that thins the product wafer before it is diced into chips, the front surface of the product wafer is placed into engagement with the socket plate with each of the solder bumps being positioned in a respective socket. The dimensions of the sockets are slightly larger than the dimensions of the bumps in order to provide a protective housing. When the bumps are positioned within the sockets, the front surface of the product wafer contacts the opposing surface of the socket plate. The backside of the product wafer may then be ground without exerting any excessive force on the bumps. In addition, the socket plate maintains the product wafer in a stable position during the grinding operation.

BRIEF DESCRIPTION OF THE DRAWINGS

The present invention will be more fully understood and appreciated by reading the following Detailed Description in conjunction with the accompanying drawings, in which.

DETAILED DESCRIPTION

Figure 1A:
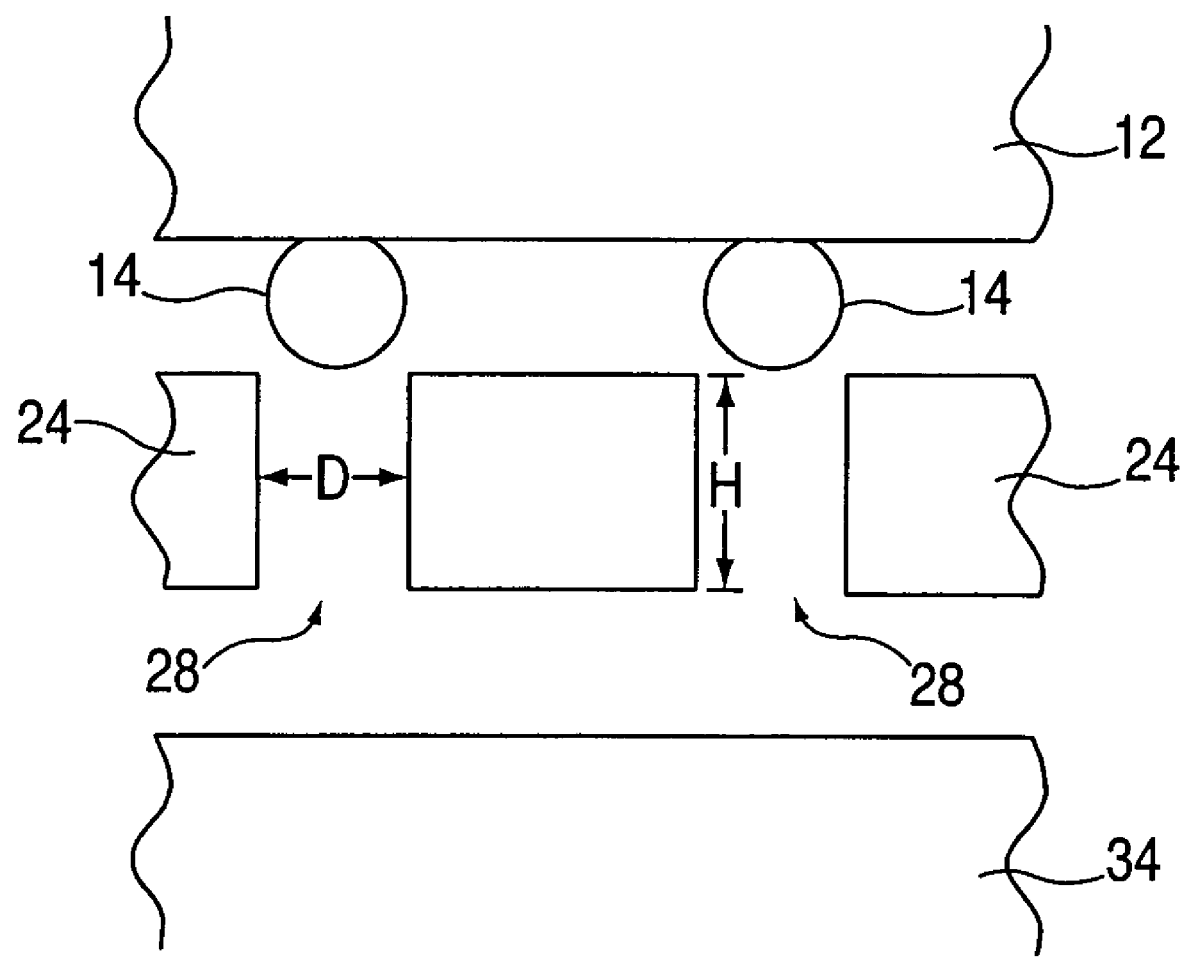
FIGS. 1a and 1b are front elevation, enlarged, cross-sectional views of the preferred and alternate embodiments of the present invention, respectively.

Referring now to the drawing figures in which like reference numeral refer to like parts throughout, there is seen in FIG. 1 a fabrication system, designated generally by reference numeral 10, employed during the grinding operation of a wafer fabrication process in order to thin a product wafer 12 prior to its being diced into chips. Product wafer 12 is of the type that includes a plurality of conductive bumps 14 formed in an array on its front surface 16 in a predetermined pattern, and an opposing back surface 18 that is adapted to be engaged by a grinding pad during the grinding operation of the fabrication process in order to thin the wafer to a predetermined thickness (generally of about 300 um).

Bumps 14 may be formed on front surface 16 by using a metal mask 20 that includes apertures 22 formed therethrough that are of about the same dimension and arranged in the same predetermined pattern as is desired for the bumps (the bumps are of a height, h, generally on the order of 50 um–100 um, and a diameter, d, generally on the order of 60–120 um).

Figure 1B:
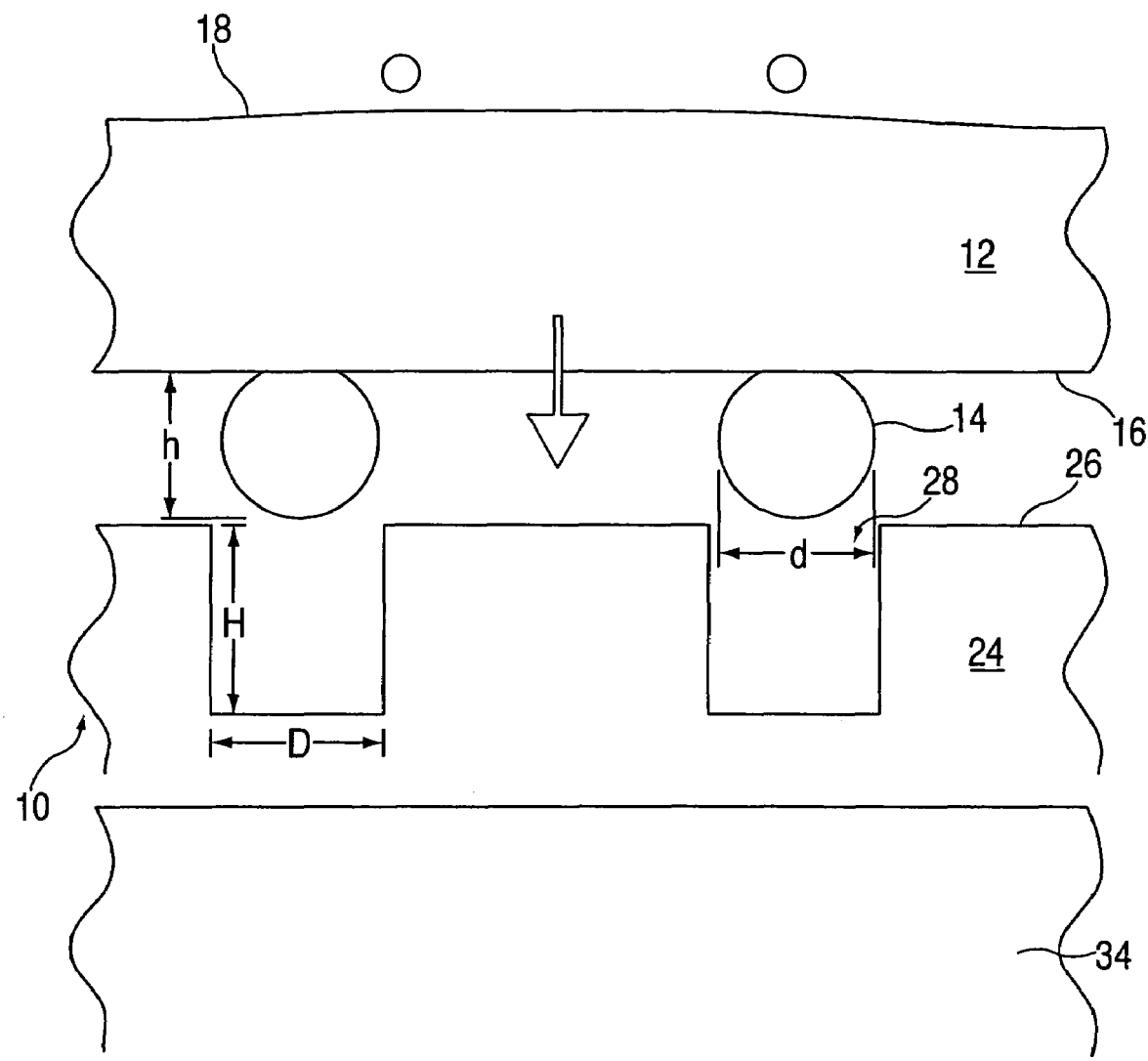
Figure 2:
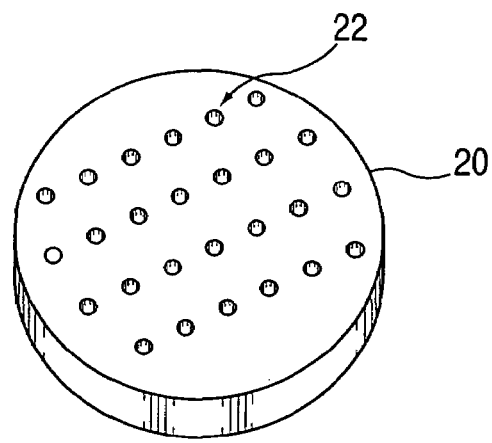
FIG. 2 is a perspective view of a typical mask used in connection with the present invention.

Fabrication system 10 further comprises a socket plate 24 that includes a front surface 26 through which (See FIG. 1a illustrating holes formed entirely through plate 24) or in which (see FIG. 1b illustrating blind holes formed in the front surface 26 of plate 24) a plurality of cavities (or "sockets" and which may be either through holes (see FIG. 1a) or blind holes (see FIG. 1b)) 28 are formed. Cavities 28 are of height, H, and diameter, D, that are slightly larger than the height, h, and diameter, d, of product wafer 12, and are equal in number and arranged in the same predetermined pattern as bumps 14, thereby permitting bumps 14 to be inserted into corresponding cavities 28 for purposes described hereinafter (bumps 14 are generally in the range of 60–120 um in diameter and 50–100 um high, and cavities 28 should be about 10–30 um greater in those dimensions than bumps 14).

Socket plate 24 may be fabricated from a silicon wafer, but may also be fabricated from a metal plate, such as one made from Molybdenum or stainless steel, or a plastic plate that may be etched. Preferably, plate 24 is also relatively thin (on the magnitude of about 0.1–1 mm in thickness), and is round with about the same diameter as bumped product wafer 12.

Figure 3A:
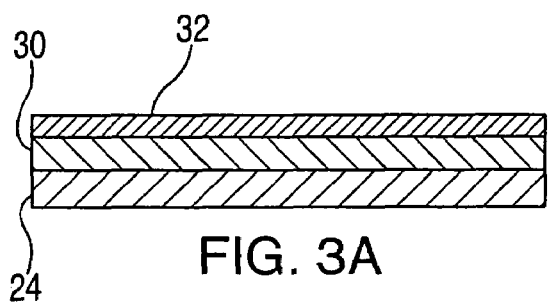
FIGS. 3A–3D are sequential, front elevation, cross-sectional views of the socket plate of the present invention in its various stages of fabrication.
Figure 3B:
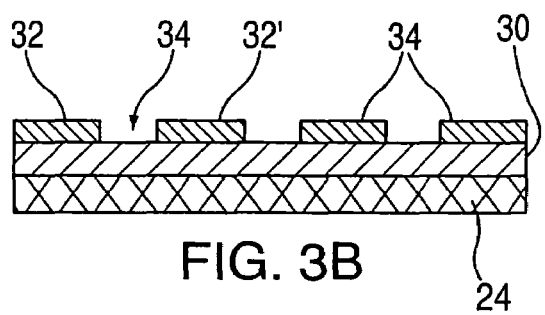
Figure 3C:
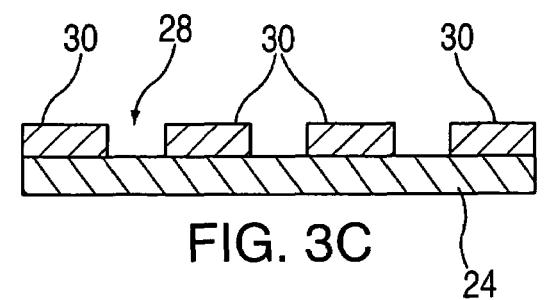
Figure 3D:
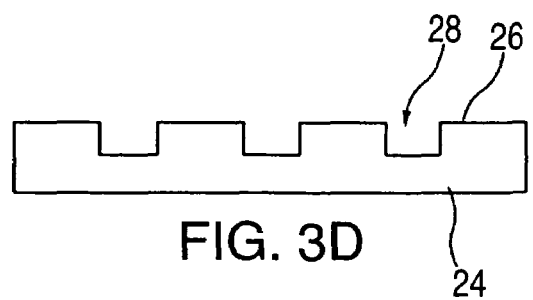

The following paragraph describes a method of fabricating a socket plate out of a silicon wafer utilizing the same Molybdenum mask used to form the solder bumps (C4 balls) on the product silicon wafer. Cavities 28 are formed by first coating a CVD (chemical vapor deposition) oxide layer 30 with a positive resist material 32, such as TOK3227 manufactured by Tokyo Ohka Kogyo Co., Ltd. (See FIG. 3A). Next, mask 20 is flipped from its orientation used to create bumps on surface 16 and is placed over CVD oxide layer 30. The resist 32 is exposed through mask 20 and then removed by the developer, thereby leaving openings 34 that correspond to the pattern of bumps 14 (See FIG. 3B). CVD oxide layer 30 is then etched using resist material 32 as a mask. The resist material 32 may then be removed, leaving an oxide hard mask (see FIG. 3C). A deep silicon etch may then be performed (if pate 24 is made of silicon) on the socket plate 24 until the cavities 28 are formed to a depth H deep enough to receive bumps 14 therein (see FIG. 3D) (as stated earlier, the cavities 28 may be formed entirely through plate 24 or partially through plate 24 with the important feature being that the depth H and diameter D are sufficient to accommodate bumps 14). If a material other than silicon is used for plate 24, such as metal or plastic, cavities 28 may be formed using well known, traditional etching techniques for metal plates, or by mechanical or laser drilling operations.

Prior to grinding the back surface 18 of product wafer 12, socket plate 24 is placed on a vacuum chuck 36 and is put into registry with product wafer 12 with each bump 14 being positioned within a corresponding cavity 28, with front surface 16 of product wafer 12 contacting surface 26 of socket plate 24. Back surface 18 may then be ground in the typical manner. The support provided to product wafer 12 by socket plate 24, permits the grinding force to be applied to back surface 18 evenly and prevents bumps 14 from incurring excessive forces from the grinding operation. It should be noted, however, that with respect to the preferred embodiment illustrated in FIG. 1a, the vacuum created by vacuum chuck 36 is effective at maintaining bumps 14 in position within cavities 28 due to the free flow of air through the cavities 28, whereas with the embodiment of FIG. 1b bumps 14 are maintained in stable position within cavities 28 due primarily to the force created by the grinding device.

What is claimed is:

1. A method for thinning a product wafer having a first surface including a plurality of conductive bumps arranged in a first pattern and a second surface to which a grinding force is to be applied to effect the thinning, said method comprising the steps of:
   a. forming a socket plate having a plurality of cavities formed therein by;
      providing a base plate having a chemical vapor deposition layer thereon;
      coating said deposition layer with a positive resist material;
      exposing said resist material with a second pattern corresponding to said first pattern;
      etching said deposition layer using said resist material as a mask;
      removing said resist material;
      etching said base plate to form a plurality of cavities arranged in said second pattern; and
      removing said deposition layer;
   b. placing said product wafer in registry with said socket plate so that each of said conductive bumps are inserted into a corresponding one of said plurality of cavities; and
   c. applying a grinding force to said second surface of said product wafer.

2. The method for thinning a product wafer according to claim 1, further comprising the step of placing said socket plate on a vacuum chuck prior to placing said product wafer in registry with said socket plate.

3. The method for thinning a product wafer according to claim 1, wherein said plurality of cavities are defined by holes formed entirely through said socket plate.

4. The method for thinning a product wafer according to claim 1, wherein said plurality of cavities are defined by blind holes formed in said first surface of said socket plate.

* * * * *